United States Patent [19]

Nakatani et al.

[11] Patent Number: 4,862,153
[45] Date of Patent: Aug. 29, 1989

[54] FLAT DISPLAY PANEL WITH FRAMING FOR FLEXIBLE SUBSTRATE FOLDING

[75] Inventors: Hiroshi Nakatani, Tenri; Hisao Kawaguchi; Shigeo Nakabu, both of Nara, all of Japan

[73] Assignee: Sharp Kabushiki Kaisha, Osaka, Japan

[21] Appl. No.: 55,527

[22] Filed: May 29, 1987

[30] Foreign Application Priority Data

May 30, 1986 [JP] Japan .................. 61-126579

[51] Int. Cl.⁴ .............................. G02F 1/13
[52] U.S. Cl. .................. 340/719; 313/511; 340/718; 350/334
[58] Field of Search ............. 340/758, 765, 784, 718, 340/719, 815.2; 350/335, 336, 344, 331 R, 339 R; 313/511

[56] References Cited

U.S. PATENT DOCUMENTS

| | | | |
|---|---|---|---|
| 4,474,432 | 10/1984 | Takamatsu et al. | 350/336 X |
| 4,514,042 | 4/1985 | Nukii et al. | 350/331 R |
| 4,549,174 | 10/1985 | Funada et al. | 340/718 |
| 4,597,635 | 7/1986 | Hoshikawa | 350/334 |
| 4,640,581 | 2/1987 | Nakanowatari et al. | 350/336 |
| 4,655,551 | 4/1987 | Washizuka et al. | 350/336 |
| 4,730,146 | 3/1988 | Maser et al. | 313/511 |

OTHER PUBLICATIONS

"Development of LCD Display Unit for Color Television", Sharp Corp., IMC Proceedings, Tokyo, May 1987.

*Primary Examiner*—James J. Groody
*Assistant Examiner*—Mark R. Powell
*Attorney, Agent, or Firm*—Birch, Stewart, Kolasch, & Birch

[57] ABSTRACT

A flat matrix display panel having every side connected to an end of a flexible wiring substrate with an LSI chip loaded thereon. The flexible wiring substrate is formed into an S shape cross section by folding the substrate along an upper and a lower frames. The LSI chip is located near the center of the S-shaped substrate. The other end of the flexible wiring substrate is connected to a PC board which has other circuit components mounted thereon.

8 Claims, 2 Drawing Sheets

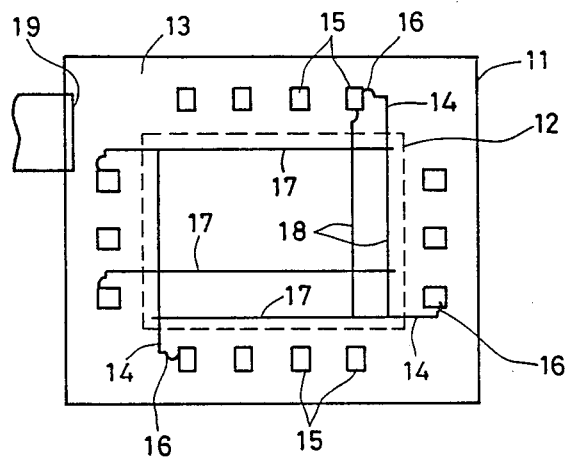
FIG.1 PRIOR ART
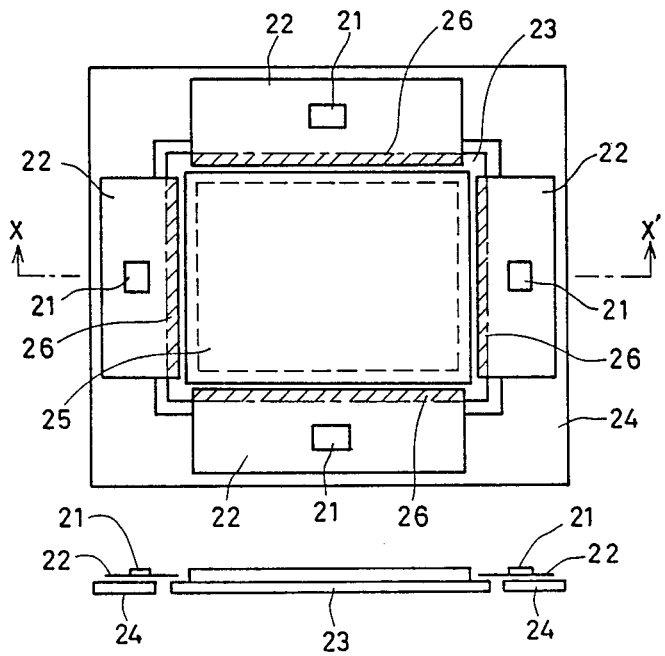
FIG.2 PRIOR ART
FIG.3 PRIOR ART

FLAT DISPLAY PANEL WITH FRAMING FOR FLEXIBLE SUBSTRATE FOLDING

BACKGROUND OF THE INVENTION

1. Field of the Invention

The present invention relates to a flat display panel for application in a thin display device such as a liquid crystal color TV.

2. Description of Prior Art

Our present Information Age demands quick and accurate access to various information. A personal information display device has drawn attention by promising means for this purpose. Low voltage, power-saving, thin and small information display devices are demanded for personal use. A liquid crystal matrix display panel meets these requirements to some extent. Research and development of the liquid crystal matrix display panel is now under way in various industrial fields, with a particular focus on a liquid crystal color TV.

The matrix display panel for a liquid crystal color TV are of two types: an active matrix type and a simple matrix type. The active matrix display panel comprises a plurality of signal electrodes, a plurality of scanning electrodes arranged in a matrix, and a switching transistor having a liquid crystal-driving electrode being formed in each intersection of the electrodes to constitute a picture element. The switching transistors, driven by external signals, select necessary picture elements, to thereby displaying a picture. Voltage on each liquid crystal-driving electrode is applied to the liquid crystal statistically. In contrast, the simple matrix display panel comprises two glass substrates. One substrate includes a plurality of signal electrodes and the other substrate includes' a plurality of scanning electrodes. The two substrates are superimposed on each other so that the signal electrodes and the scanning electrodes are arranged in a matrix. The picture element in each intersection of the electrodes is driven dynamically. In either matrix panel type, the signal electrodes and scanning electrodes are extended outside the picture element region and connected to the output terminals of LSI chips, respectively. A color filter is indispensable in the panel. Moreover, the panel is required to transmit light and includes a light source such as a fluorescent lamp.

In a typical liquid crystal active matrix color display panel, the conventional liquid crystal display module includes a substrate on which LSI chips for driving the matrix are mounted as described in the following.

FIG. 1 shows an example of the conventional liquid crystal display module. A wiring region with distributing electrodes 14 formed thereon is provided in the peripheral region 13 of the picture element region 12 of a liquid crystal display panel 11, so that liquid crystal-driving LSI chips 15 can be mounted directly on the display panel 11. Input and output leads are connected to the pads 16 of the LSI chips 15 either by wire bonding, TAB or a flip chip bonding method.

In the liquid crystal display module of the above construction, the wiring region and the LSI chip-mounting region are located in the peripheral region 13 of the picture element region of the liquid crystal display panel 11. In addition, the panel 11 must include another region 19 for connection with an external circuit which supplies signals to the LSI chips 15. Consequently, the area of the display panel 11 becomes rather large compared with the area of the picture element region 12. Particularly when the display panel of this type is used in a portable display device having a two to three inch screen, the area occupied by the wiring region, the LSI chip-mounting region and and external circuit-connecting region is obviously large for the screen size. As a larger display panel is used, the number of display panels that can be obtained from a glass substrate sheet of a given size decreases, and a cost increase results. Besides, in a case where numerous LSI chips are loaded, the input signal lines must have a multilayer interconnection, to effect achieve a simpler structure and smaller area of the region for connecting the input signal lines of the LSI chips to the external circuit. This method would, however, sacrifice the yield of the a liquid crystal display module.

A proposed method for removing the above disadvantages uses a flexible substrate on which liquid crystal-driving LSI chips are mounted and the substrate is connected to a liquid crystal display panel by soldering by using thermoplastic anisotropic conductive sheets or is anisotropic conductive rubber connectors. The proposed construction is described in detail below.

FIG. 2 is a plan view of a second example of the conventional liquid crystal matrix display panel, and FIG. 3 is a sectional view taken along the line X-X' of FIG. 2. A flexible substrate 22 with liquid crystal-driving LSI chips 21 loaded thereon is positioned properly with respect to the electrodes on a liquid crystal display panel 23 and the substrate is connected to the panel 23 by soldering. The other end of the flexible substrate 22 is connected by soldering with a ▯-shaped double side printed circuit pc board 24 on which input signal lines (common wiring) are printed.

Because the LSI's 21 are mounted on the flexible substrate 22, the liquid crystal display panel 23 may be of a large enough size to accomodate a picture element region 25 and a joint margin 26 for connection with the flexible substrate 22. Accordingly, the liquid crystal display panel 23 can be made small, resulting in cost reduction. However, because the PC board 24 is placed on the same plane as the liquid crystal display panel 23 as shown in FIG. 3, the entire set size increases with the screen size, a fatal barrier to a portable display device results. In addition, when chip components and controllers requiring shields, as required by LSI chips, are to be mounted on the PC board 24, the PC board 24 must be made larger. Besides, a height restriction exists for the components to be mounted.

OBJECTS OF THE INVENTION

Accordingly, an object of the present invention is to provide a novel structure for a flat, and thin matrix display panel.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

A flat display panel of an embodiment of the present invention comprises a flexible substrate with an LSI chip mounted thereon being provided adjacent to a peripheral area of a picture element region. The flexible substrate is folded along two upper and lower frames so that a part of the flexible substrate is placed between the upper and lower frames.

Since the flexible substrate is folded into an S shape section along the upper and lower frames that is mounted adjacent to the panel connecting region, a wiring region, an LSI chip-mounting region and an external circuit-connecting region on the outside of the picture element region provide a multilayer construction. Therefore, an increase in the screen size results in an increase in the entire set size but a smaller increase ratio occurs than in the conventional display panels. Besides, the height restriction is relieved for components that are mounted on the PC board. As a result, the flat display panel can be made smaller and can be produced at a lower cost. Furthermore, owing to fact that the chip components can be mounted on the PC board at any desired position in the longitudinal or lateral direction from the picture element region, the structure of the present embodiments can be easily applied to both vertical and lateral display devices.

BRIEF DESCRIPTION OF THE DRAWINGS

The embodiments of the present invention will be better understood from the detailed description given hereinbelow and the accompanying drawings which are given by way of illustration only, and thus are not limitative of the present invention and wherein:

FIG. 1 is a plan view of an example of the conventional flat display panel;

FIG. 2 is a plan view of another example of the conventional flat display panel;

FIG. 3 is a sectional view taken along the line X-X' of FIG. 2;

DESCRIPTION OF THE PREFERRED EMBODIMENTS

Figure 5:
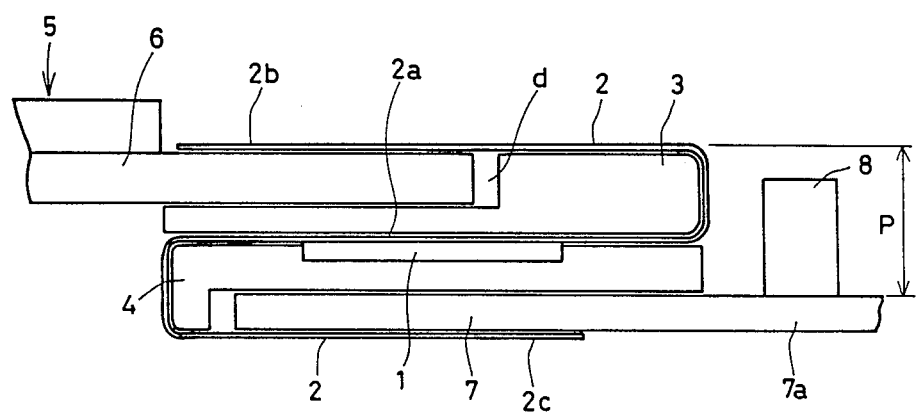
FIG. 5 is a sectional view taken along the line II-II' of FIG. 4.

According to an embodiment of the present invention, a flexible substrate 2 having a liquid crystal-driving LSI chip 1 mounted thereon is provided adjacent to a peripheral area of a picture element region 5. The flexible substrate 2 is folded along upper and lower frames 3 and 4 so that a part 2a of the flexible substrate 2 is placed between the upper and lower frames 3 and 4. In other words, the flexible substrate 2 is formed into an S shape section as shown in FIG. 5. The structure of the flexible substrate 2 thus compared including the frames 3 and 4 is provided adjacent to all of the four sides of the peripheral area of the picture element region 5 of a liquid crystal display panel 6. A gap "d" is provided between the frame 3 and the display panel 6.

The flat display panel of the present embodiment is manufactured in the following process. An end portion 2b of the flexible substrate 2 is connected to the liquid crystal display panel 6 by, by using a thermoplastic anisotropic conductuve sheet or by using an anisotropic conductive rubber connector. With the resulting display module (comprising the display panel 6 that is connected to the flexible substrate 2) being fit on the upper frame 3, the flexible substrate 2 is folded along the right side and the bottom surfaces of the upper frame 3 as shown in FIG. 5. The lower frame 4 that is formed integrally with a PC board 7 is fixed to the upper frame 3 by screws through the portion 2a of the flexible substrate 2. The flexible substrate 2 is then folded along the left side and the bottom surfaces of the lower frame 4 as shown in FIG. 5. The other end portion 2c of the flexible substrate 2 is connected to the PC board 7 by, by using a thermoplastic anisotropic conductive sheet or by using an anisotropic conductive rubber connector. Input signal lines (not shown) and a controller component 8 are mounted on the PC board 7 in advance.

The PC board 7 that is connected to the folded flexible substrate 2 projects to the right (of FIG. 5) from the flexible substrate 2. The controller component 8 is mounted at the projected portion 7a of the PC board 7.

According to the present embodiment, the distance "P" between the top surface of the PC board 7 and the top surface of the liquid crystal display panel 6 is about 3 mm which is sufficiently large to accommodate the height of chip components to be mounted on the PC board 7, so there is virtually no height restriction for the chip components. If a wide tape carrier having an LSI chip 1 mounted thereon by inner lead bonding is used as the flexible substrate 2, the device mounting process can be omitted and no additional wiring substrate is necessary, and a cost reduction.

Figure 4:
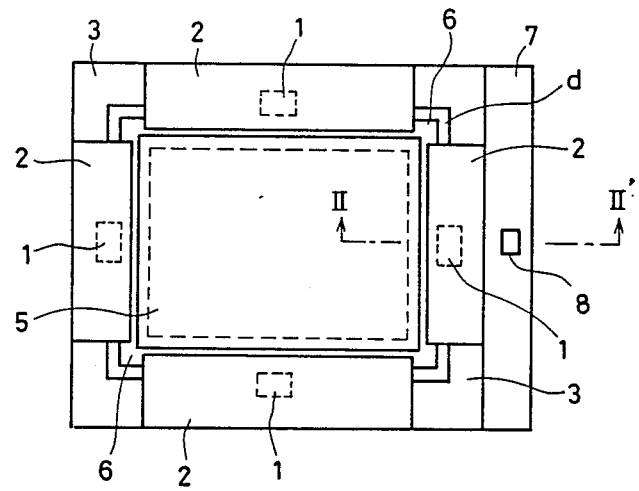
FIG. 4 is a plan view of an embodiment of a flat display panel of the present invention.

As mentioned earlier, the flexible substrate 2 that is folded into an S shape along the frames 3 and 4 is mounted adjacent to all of the four sides of the picture element region 5 of the liquid crystal display panel 6. The PC board 7 may be projected from the flexible substrate 2 in any desired direction: to the right as shown in FIG. 4, leftward, upward or downward depending upon the shape of a display device which applies to the present embodiment. Specifically, in a vertical pocket display device, for instance, the PC board 7 is projected upward, downward or in both directions so that the controller component 8 can be mounted on the vertically projected portion reduce the lateral dimension. For a lateral type, display device on the other hand, the PC board 7 is projected to the right, to the left or in both directions so that the controller component 8 can be mounted on the laterally projected portion for reduction in the vertical dimension.

In the present embodiment of the invention, the driving LSI chip 1 is disposed under the liquid crystal display panel 6 to make the display device smaller.

In the above embodiment, the structure is applied to an active liquid crystal matrix display panel. Also, it is mentioned that the structure is applicable to a general flat display panel including an EL.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A display panel comprising:
   a flexible substrate having an LSI chip mounted to substantially a middle portion thereof;
   a flat display panel element connected to a first end portion of said flexible substrate;
   a first frame positioned adjacent to said display element, said flexible substrate having a second portion folded about said first frame; and
   a second frame positioned opposite to said second portion of said flexible substrate, said first frame and said display element, said flexible substrate having said middle portion constrained between said first and second frames, said second frame having a recess for positioning said LSI chip.

2. The display panel of claim 1, further comprising a printed circuit board connected to a third portion of said flexible substrate between said third portion and said second frame means, said printed circuit board projecting from said flexible substrate for mounting circuit components thereon.

3. The display panel of claim 1, wherein said flexible substrate is a wide tape carrier.

4. The display panel of claim 1, wherein said display element means is a liquid crystal display.

5. The display panel of claim 1, wherein said display element means is an electro luminescent display.

6. A display panel comprising:
a flat panel display element having a terminal edge;
a flexible substrate having an LSI chip mounted at substantially a middle portion, said flexible substrate being arranged to wrap around said terminal edge of said flat panel display element; and
a frame to aid and constrain the routing of said flexible substrate to enable first and second controlled direction reversals thereof, said frame having a recess for positioning said LSI chip.

7. The display panel of claim 6, wherein said frame comprises an upper frame portion for enabling said first controlled direction reversal and having said recess for positioning said LSI chip and a lower frame portion positioned opposite to said upper frame portion for enabling said second controlled direction reversal of said flexible substrate.

8. The display panel of claim 7, further comprising a printed circuit board connected between said flexible substrate and said lower frame.

* * * * *